(12) United States Patent
Luzzi

(10) Patent No.: US 7,193,481 B2
(45) Date of Patent: Mar. 20, 2007

(54) APPARATUS FOR PROVIDING A JITTERED CLOCK SIGNAL AND APPARATUS FOR PROVIDING A RANDOM BIT

(75) Inventor: Raimondo Luzzi, Graz (AT)

(73) Assignee: Infincon Technologies AG (DE)

( * ) Notice: Subject to any disclaimer, the term of this patent is extended or adjusted under 35 U.S.C. 154(b) by 376 days.

(21) Appl. No.: 10/934,302

(22) Filed: Sep. 3, 2004

(65) Prior Publication Data
US 2005/0231294 A1    Oct. 20, 2005

(30) Foreign Application Priority Data
Sep. 4, 2003    (EP)    ................... 03020077

(51) Int. Cl.
*H03B 29/00*    (2006.01)
(52) U.S. Cl. .................. 331/78; 708/250; 708/251; 708/255
(58) Field of Classification Search .................. 331/78; 708/250, 251, 255
See application file for complete search history.

(56) References Cited

U.S. PATENT DOCUMENTS

| | | | |
|---|---|---|---|
| 2,952,817 A * | 9/1960 | Kennedy | ...................... 331/68 |
| 4,853,884 A | 8/1989 | Brown et al. | |
| 6,844,786 B2 * | 1/2005 | Pan et al. | ...................... 331/78 |

FOREIGN PATENT DOCUMENTS

EP    0 981 081 A2    2/2000

OTHER PUBLICATIONS

Tian, Hui, et al., "Analysis of Temporal Noise in CMOS Photodiode Active Pixel Sensor", IEEE Journal of Solid-State Circuits, vol. 36, No. 1, Jan. 2001, pp. 92-101.
Petrie, Craig S., et al., "A Noise-Based IC Random Number Generator for Applications in Cryptography", IEEE Transactions on Circuits and Systems—I: Fundamental Theory and Applications, vol. 47, No. 5, May 2000, pp. 615-621.
Bucci, M., et al., "A High Speed Truly IC Random Number Source for Smart Card Microcontrollers", IEEE, 2002, pp. 239-242.
Bucci, Marco, et al., "A High-Speed Oscillator-Based Truly Random Number Source for Cryptographic Applications on a Smart Card IC", IEEE Transactions on Computers, vol. 52, No. 4, Apr. 2003, pp. 403-409.

* cited by examiner

*Primary Examiner*—Joseph Chang
(74) *Attorney, Agent, or Firm*—Dickstein, Shapiro, LLP.

(57) ABSTRACT

An apparatus for providing a jittered clock signal has a reverse-biased diode. The reversed-biased diode has a leakage current which decreases a reverse voltage on the diode, time-dependent on a shot-noise of the leakage current. The apparatus for providing a jittered clock signal further has a unit for periodically increasing the reverse voltage of the diode to a value, which is above a switching value and the apparatus has a unit for comparing the reverse voltage of the diode to the switching value and for outputting a jittered clock signal dependent on the comparison.

10 Claims, 6 Drawing Sheets

APPARATUS FOR PROVIDING A JITTERED CLOCK SIGNAL AND APPARATUS FOR PROVIDING A RANDOM BIT

CROSS-REFERENCE TO RELATED APPLICATION

This application claims priority from European Patent Application No. 03 020 077.8, which was filed on Sep. 4, 2003, and is incorporated herein by reference in its entirety.

BACKGROUND OF THE INVENTION

1. Field of the Invention

The present invention relates to an apparatus for providing a jittered clock signal and to an apparatus for providing a random bit and, in particular, to an apparatus for providing a jittered clock signal and an apparatus for providing a random bit, which comprise a diode.

2. Description of the Related Art

The expanding field of digital communication requires solutions for securing data which is stored and transferred to and from a digital communication system. Cryptographic algorithms that require a high quality random number source are widely used in communication systems and especially in Smart Cards. Random numbers are used for secret keys, signatures, authentication protocols, padding bytes or blinding values. Typically, a Smart Card micro-controller features a truly random number generator among its peripheral devices. Even modern motherboards or PCs comprise a security device, which includes a random number generator.

According to the prior art, direct amplification of a noise source from a non-deterministic natural source, like electronic noise or radioactive decay, jittered oscillator sampling and discrete-time chaotic maps are widely exploited for generating a random stream. Such techniques are often combined in order to improve a near-random behaviour of a particular random stream generating technique.

The paper "A high-speed oscillator-based truly random number generator", M. Bucci, L. Germani, R. Luzzi, A. Trifiletti, M. Varanonuovo, IEEE Trans. Computers, Vol. 52, No. 4, pp. 403–409, Apr. 2003 describes a truly random number generator which exploits the jittered oscillator technique, where a sampling oscillator is provided with an amplified noise source in order to achieve a high jitter to mean period ratio.

The paper "A high-speed truly IC random number of source for Smart Card microcontrollers", M. Bucci, L. Germani, R. Luzzi, P. Tommasino, A. Trifiletti, M. Varanonuovo, Proc. gth IEEE International Conf. On Electronics, Circuits and Systems (ICECS 2002), pp. 239–242, Sep. 2002 presents a design of a very high-speed thermal noise-based mixed-signal random number generator, which features a near-random behaviour for clock frequencies up to 80 MHz. The proposed random number generator is based on an amplification of thermal noise from integrated resistors. The amplified noise is compared to a reference voltage by a clocked comparator whose output is random bit-streamed.

The noise-based random number generation technique is the most popular technique for generating a random stream. Nevertheless, the lack of adequate shielding from power supply and substrate signals in an integrated circuit environment prohibits the exclusive use of this method for integrated circuit-based cryptographic systems. Published random number generator designs using ring oscillators report that typical levels of oscillator jitter are not nearly sufficient to produce statistical randomness. Consequently, pseudo-random techniques are added to further randomise the output. The same is true for discrete-time chaos systems that can be electronically implemented using discrete-time analogue signal processing techniques.

Therefore, the paper "A noise-based IC random number generator for applications in cryptography", C. S. Petrie, J. A. Connelly, IEEE Trans. Circuits and Systems 1, Vol. 47, No. 5, pp. 615–621, May 2000 proposes a combination of direct amplification, oscillator sampling and discrete-time chaos, for a random number generating system. Amplified thermal noise is summed into an analogue-digital-based chaotic system that is used to drive a current-controlled oscillator. The current-controlled-oscillator output is assembled at a lower, user-defined clock frequency using a data flip-flop. Due to the combination of three techniques for generating a random stream, the architecture is very complex.

SUMMARY OF THE INVENTION

It is an object of the present invention to provide a cost-effective, low area and power requiring apparatus for providing a true deterministic jittered clock signal and an apparatus for providing a random bit.

In accordance with a first aspect, the present invention provides an apparatus for providing a jittered clock signal, having: a reverse-biased diode, wherein the diode has a leakage current which decreases a reverse voltage on the diode, time-dependent on a shot-noise of the leakage current; means for periodically increasing the reverse voltage of the diode to a value which is above a switching value, and means for comparing the reverse voltage of the diode to the switching value and for outputting a clock signal dependent on the comparison.

In accordance with a second aspect, the present invention further provides an apparatus for providing a random bit having: a first apparatus for providing a first jittered clock signal and a second apparatus for providing a second jittered clock signal, both having a reverse-biased diode, wherein the diode comprises a leakage current which decreases a reverse voltage on the diode, time-dependent on a shot-noise of the leakage current, a unit for periodically increasing the reverse voltage of the diode to a voltage which is above a switching value, and a unit for comparing the reverse voltage of the diode to the switching value and for outputting a first and a second jittered clock signal, respectively, dependant on the comparison; and means for comparing the first and the second clock signal and for outputting a random bit dependent on a result of the comparison.

The present invention is based on the finding that a shot-noise of a leakage current of a reverse-biased diode can be advantageously used for generating a jittered clock signal.

According to the inventive arrangement, the reverse-biased diode is supplied with an input signal that periodically increases the reverse voltage of the diode. Due to its characteristic, the apparatus for providing a jittered clock signal generates a jittered output signal from the periodic input signal.

The paper, Analysis of temporal noise in CMOS photodiode active pixel sensor", H. Tian, B. Fowler, A. El Gamal, IEEE J. Solid-State Circuits, Vol. 36, No. 1, pp. 92–101, Jan. 2001 presents an analysis of a photodiode shot noise.

According to a preferred embodiment of the present invention, two apparatus for providing a jittered clock signal are combined for providing an apparatus for providing a random bit. A true random bit stream is obtained by comparing the jittered clock signal outputs of the first and the second apparatus for providing a jittered clock signal outputting a random bit based on the comparison.

The inventive arrangement offers a very low power dissipation, a low area requirement in an integrated circuit and an easy portability within different designs, as no analogue circuits are employed. Moreover, a symmetrical layout is possible for the apparatus for providing a random bit, thus avoiding a sensibility to deterministic disturbances. In an embodiment which comprises a plurality of jittered clock signals, the high jitter level of the jittered clock signals presents a synchronisation of the different jittered clock signals due to power supply and substrate couplings.

BRIEF DESCRIPTION OF THE DRAWINGS

Preferred embodiments of the present invention are described hereinafter, making reference to the appended drawings.

DESCRIPTION OF PREFERRED EMBODIMENTS

Figure 1:
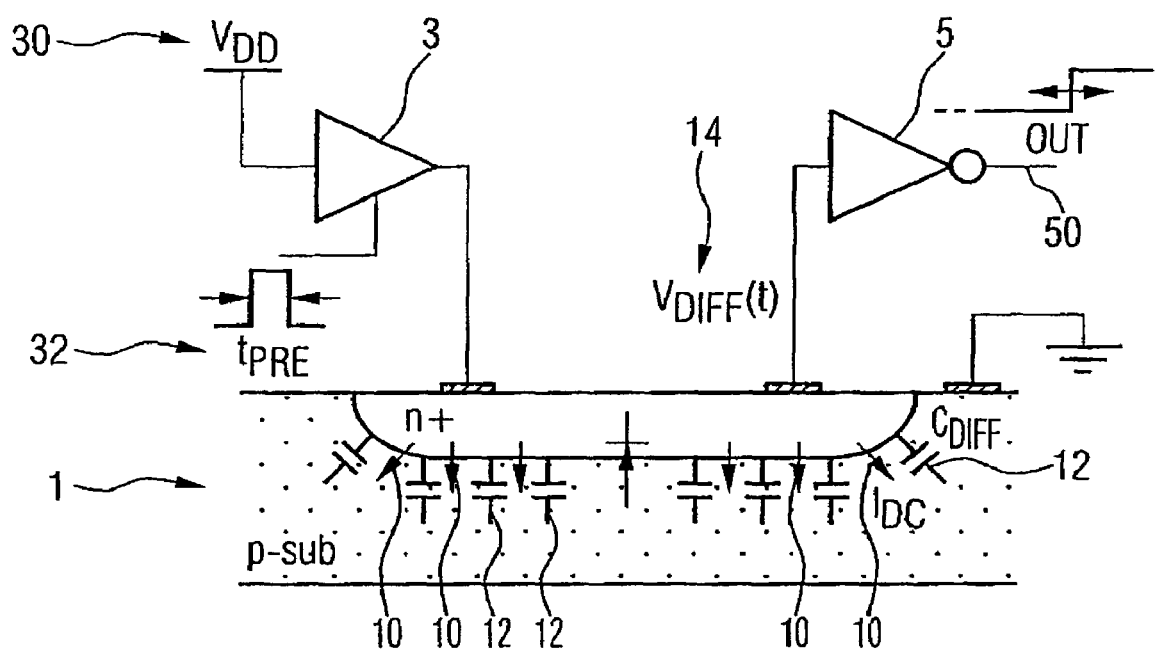
FIG. 1 shows a schematic view of an apparatus for providing a jittered clock signal according to the present invention.

FIG. 1 shows an apparatus for providing a jittered clock signal according to a preferred embodiment of the present invention. The apparatus for providing a jittered clock signal comprises a reverse-biased diode 1, means 3 for periodically increasing a reverse voltage of the diode 1 and means 5 for comparing the reverse voltage of the diode 1 to a switching value and for outputting a clock signal depending an the comparison.

In this embodiment, the diode 1 is a reverse-biased P-N junction, like an n/n+ resistance diffused into the p-type substrate. The means 3 for periodically increasing a reverse voltage of the diode 1 is a tri-state buffer and the means 5 for comparing a reverse voltage of the diode 1 to a threshold voltage and for outputting a clock signal depending on the comparison is a CMOS inverter.

The depletion region $A_{DIFF}$ Of the diode 1, comprises a leakage current or dark current $I_{DC}$ 10 due to thermally generated minority carriers. A shot noise $I_{DC}(t)$ is associated to such a leakage current 10. The depletion region of the reverse biased diode 1 offers a capacitance $C_{DIFF}$ 12. The tri-state buffer 3 charges a reverse voltage $V_{DIFF(t)}$ 14 of the capacitance $C_{DIFF}$ 12 by connecting the diode 1 to a supply voltage $V_{DD}$ 30. When the tri-state buffer 3 is tri-stated, the capacitance $C_{DIFF}$12 discharges due to the current $I_{DC}$10. During the discharge time, the shot noise $I_{DC}(t)$ of the current $I_{DC}$10 is integrated by the capacitance $C_{DIFF}$12, thus obtaining a variance for the reverse voltage $V_{DIFF}(t)$ 14 which represents a diffusion voltage of the diode 1. The inverter 5 is connected to the depletion region of the diode 1 and compares the reverse voltage $V_{DIFF}(t)$ 14 to a threshold voltage $V_{TH}$. The inverter 5 outputs an output signal 50 which depends on the time, it takes the reverse voltage $V_{DIFF}(t)$ 14 to decrease from the supply voltage $V_{DD}$ 30 to the threshold voltage $V_{TH}$. Thus, a switching time of the output signal 50 depends on a random variable due to the shot noise $I_{DC}(t)$. As the tri-state buffer 3 periodically increases the reverse voltage $V_{DIFF}(t)$ 14, the output signal 50 is a jittered clock signal 50.

Figure 2:
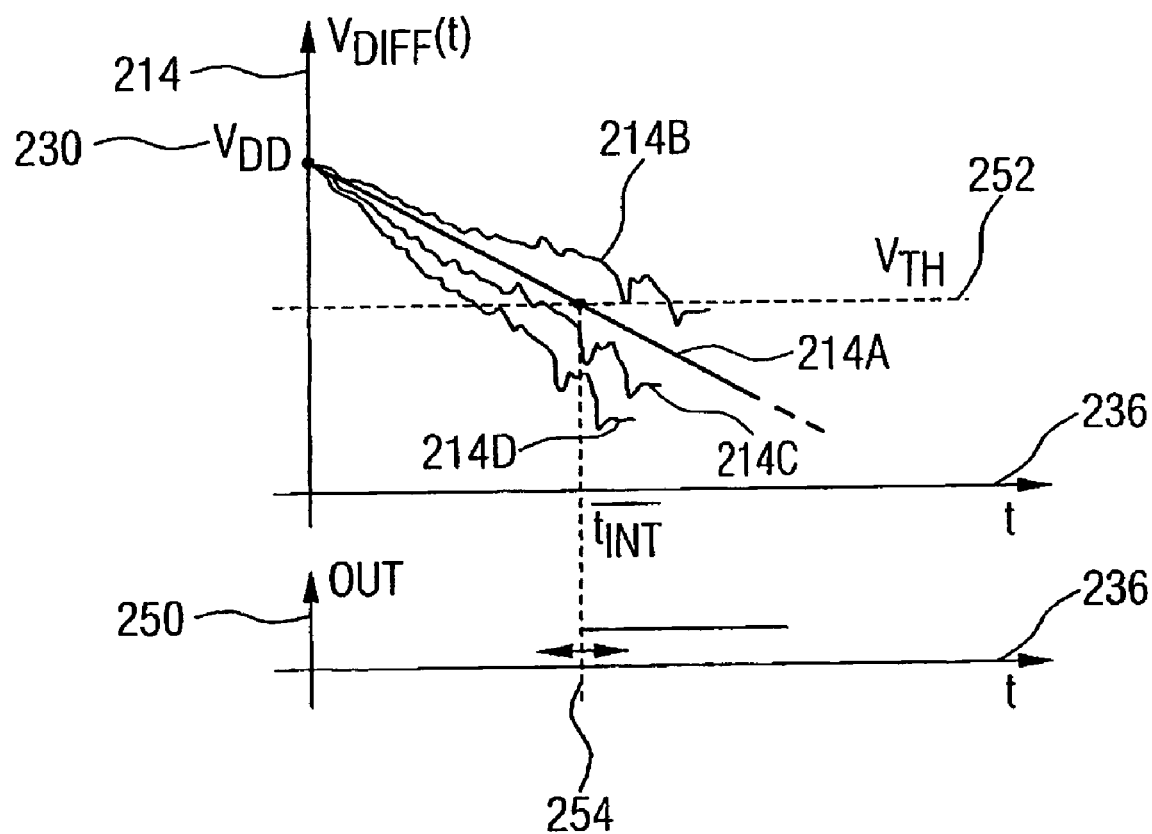
FIG. 2 shows a characteristic decrease of a reverse voltage of an apparatus for providing a jittered clock signal according to a preferred embodiment of the present invention.

FIG. 2 shows characteristic decreases of a diffusion voltage $V_{DIFF}(t)$ 214 in an apparatus for providing a jittered clock signal as it is shown in FIG. 1. During the time period 236 the diffusion voltage $V_{DIFF}(t)$ 214 decreases due to a leakage current $I_{DC}$. Further, FIG. 2 shows a jittered clock signal 250 as it is outputted from the apparatus for providing a jittered clock signal.

A first characteristic 214a shows an idealized decrease of the diffusion voltage $V_{DIFF}(t)$ 214 from the supply voltage 230 due to the leakage current $I_{DC}$, if there is no shot noise $I_{DC}(t)$. When the diffusion voltage $V_{DIFF}(t)$ 214 decreases to a threshold voltage $V_{TH}$252 the output clock signal 250 is switched 254. As a realistic leakage current $I_{DC}$ of a diode comprises a shot noise $I_{DC}(t)$, realistic characteristics 214b, c, d differ from the theoretical characteristic 214a. Thus, the decrease of the diffusion voltage $V_{DIFF}(t)$ 214 can be faster (214c, 214d) or slower (214b) than the theoretical decrease 214a. Therefore, the diffusion voltage $V_{DIFF}(t)$ 214 decreases to the threshold voltage $V_{TH}$252 not in a fixed time period, but after a time period that includes a random variable. Thus, the switching time 254 of the output clock signal 250 depends on the random variable which is responsible for the jitter of the output clock signal 250.

Figure 3:
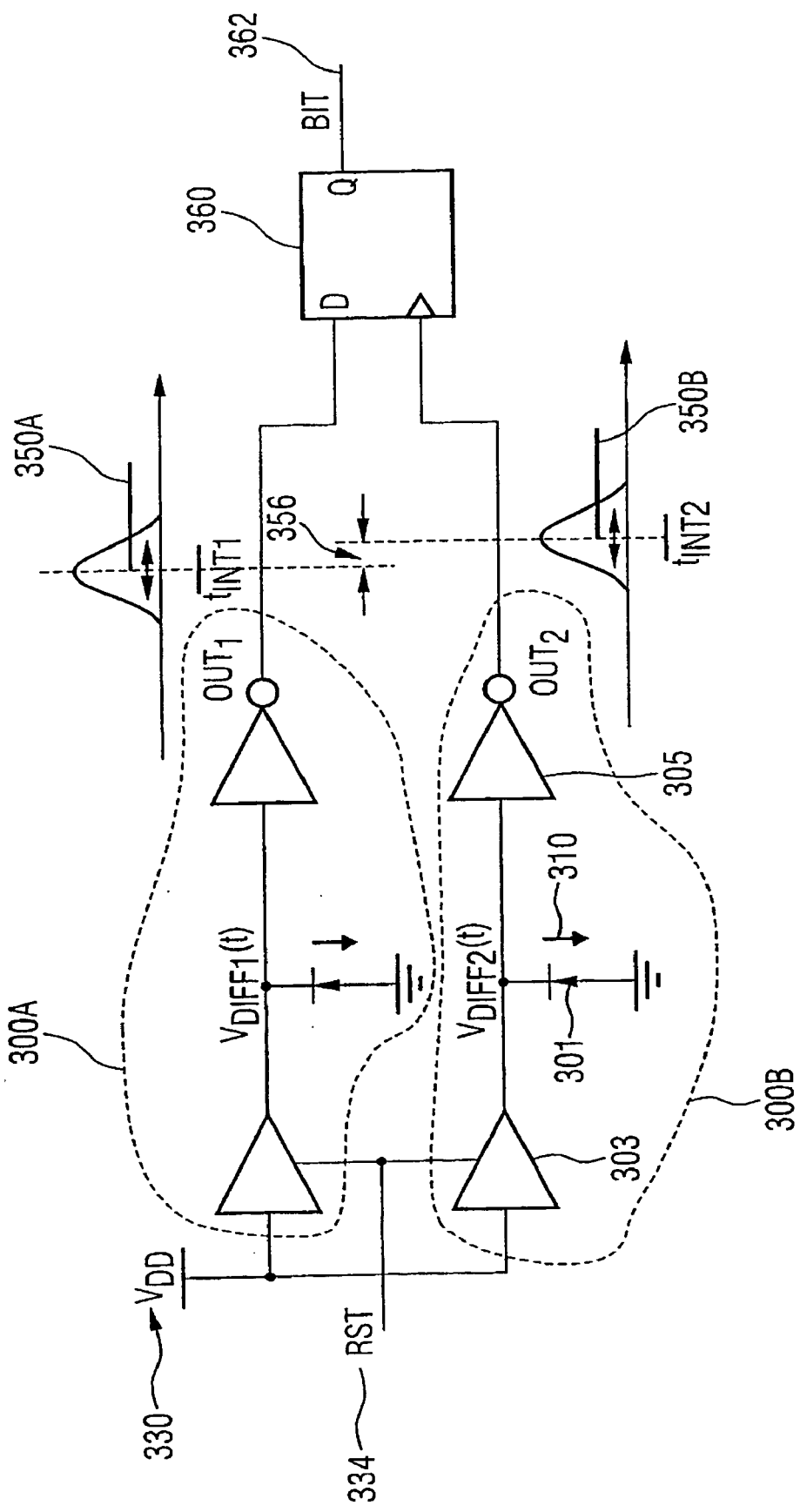
FIG. 3 shows a schematic view of an apparatus for providing a random bit according to a preferred embodiment of the present invention.

According to a further embodiment, a variance of the switching time 254 is exploited to generate a random bit. FIG. 3 shows a schematic view of an apparatus for providing a random bit based on the jittered output clock signal of an apparatus for providing a jittered clock signal.

FIG. 3 shows an apparatus for providing a random bit, which comprises a first apparatus 300a for providing a jittered clock signal and a second apparatus 300b for providing a jittered clock signal. As described in FIG. 1, each apparatus 300a, b comprises a reverse-biased diode 301, a tri-state buffer 303 and an inverter 305. The diode 301 comprises a leakage current $I_{DC}$310. A supply voltage $V_{DD}$ 330 is applied to the diodes 301, while the tri-state buffers 303 are in an active state. The tri-state buffers 303 switch according to a periodic reset signal 334. Each apparatus for providing a jittered clock signal 300a, b outputs a jittered clock signal 350a, 350b. As described in FIG. 2 each jittered clock signal 350a, 350b comprises a random switching characteristic. Thus, a switching time of the jittered clock signals 350a, b varies around a mean switching time.

The two jittered clock signals 350a, b are taken as an input to a sampling circuit 360. In this embodiment, the sampling circuit 360 is a digital flip-flop. The first jittered clock signal 350a is connected to the data input of the digital flip-flop 360 and the second jittered clock signal 350b is connected to the clock input of the digital flip-flop 360. Thus, the second jittered clock signal 350b is used to sample the first jittered clock signal 350a. The sampled first jittered clock signal 350a is outputted by the digital flip-flog 360 as a random bit 362.

The value of the random bit depends on the switching times of the jittered clock signals 350a, b. In order to generate a true random bit stream 362, the mean switching time values of the jittered clock signals 350a, b have to be aligned. Although the apparatus for providing a random bit comprises two nominally-identical apparatus 300a, b for providing a jittered clock signal, the two mean switching time values are different due to matching errors in the diffusion regions, driver-disable times, inverter thresholds, inverter communication times and inter-connection delays. In the embodiment shown in FIG. 3, the mean switching time of the first apparatus 300a is smaller than the mean switching time of the second apparatus 300b, resulting in an unbalanced bit stream of the random bits 362.

Figure 4:
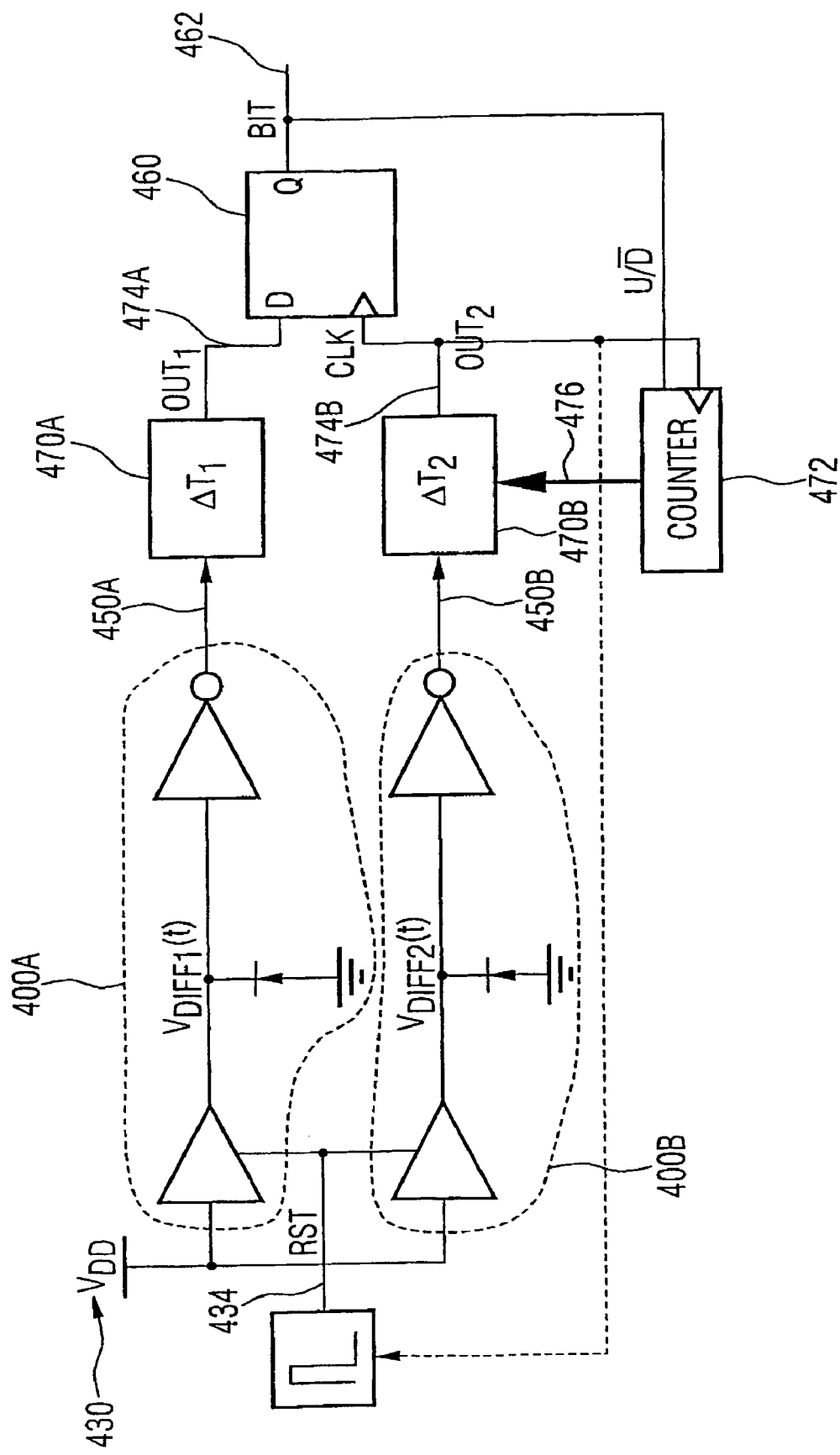
FIG. 4 shows a further embodiment of an apparatus for providing a random bit.

In order to avoid the time difference 356 of the switching times of the two jittered clock signals 350a, b which causes an unbalanced bit stream of the random bits 362, an alignment of the mean switching times is to be controlled by a feedback loop, as it is shown in the embodiment of an apparatus for providing a random bit in FIG. 4.

According to the embodiment shown in FIG. 3, the embodiment shown in FIG. 4 comprises a first apparatus 400a and a second apparatus 400b for providing a jittered clock signal which are supplied by a supply voltage 430 which is controlled by a reset signal 434. A first and a second jittered clock signal 450a, b are outputted by the two apparatus 300a, b for providing a jittered clock signal.

The jittered clock signals 450a, b are not directly connected to a flip-flop 460, which outputs a random bit 462, but to means for aligning a mean switching time of the jittered clock signal 450a to a mean switching time of the second jittered clock signal 450b. The means for aligning comprise means for delaying 470a, b of the jittered clock signals 450a, b and a counter 472. The first means for delaying 470a is connected to the first jittered clock signal 450a and outputs a first delayed clock signal 474a. The second means for delaying 470b is connected to the second jittered clock signal 450b and outputs a second delayed jittered clock signal 474b. The delayed clock signals 474a, b are connected to the flip-flop 460. The random bit 462 is outputted by the flip-flop 460 by way of sampling the first delayed clock signal 474a by the second delayed clock signal 474b. The counter 472 is an up/down counter which counts a counting value up or down depending on the value of the random bit 462. Therefore, the counter 472 takes the random bit 462 as an input. The counter 472 is triggered by the second delayed clock signal 474b. Depending on the counting value, the counter 472 sets 476 a delay time of the second means for delaying 470b. Furthermore, the second delayed clock signal 474b is used to control the reset signal 434, which controls the state of the tri-state buffers of the apparatus 300a, b for providing a jittered clock signal.

Thus, a feedback loop is realized in order to align the mean switching times of the first and the second jittered clock signals 350a, b. The first jittered clock signal 450a is delayed by the first means for delaying 470a by a time $\Delta T_1 = (T_2 - T_1)/2$, whereas the second jittered clock signal 450b is delayed by the second means for delaying 470b by a time delay $\Delta T_2 \epsilon [T_1, T_2]$. The time delay $\Delta T_2$ is a variable delay according to the setting output 476 of the counter 472. The counter 472 is used to estimate a mean value of the random bits 362. A precision much smaller than the available jitter of the jittered clock signals 450a, b is required to adjust the delay $\Delta T_2$. The exact value of the delay $\Delta T_2$ is obtained from a biasing error that can be tolerated on a mean value of the random bit 362 stream.

Once a random bit 462 has been generated, triggered by a rising edge of the second delayed clock signal 474b, a new reset pulse an the reset signal 434 is required to charge again the diffusion capacitances of the diodes of the first and the second apparatus 400a, 400b for providing a jittered clock signal. Thus, the second delayed clock signal 474b is used to trigger reset pulses on the reset signal 434, thus obtaining a continuous operation of the apparatus for providing a random bit.

Due to the symmetric arrangement of the two apparatus 400a, b for providing a jittered clock signal, common-mode disturbances do not affect the random bit output 462 if a symmetrical layout for the arrangement and, in particular, an inter-digitated layout for the N+ diffusions is used.

A further advantage of the feedback loop is a compensation of the leakage current values which comprise a variation over process and temperature.

Figure 5:
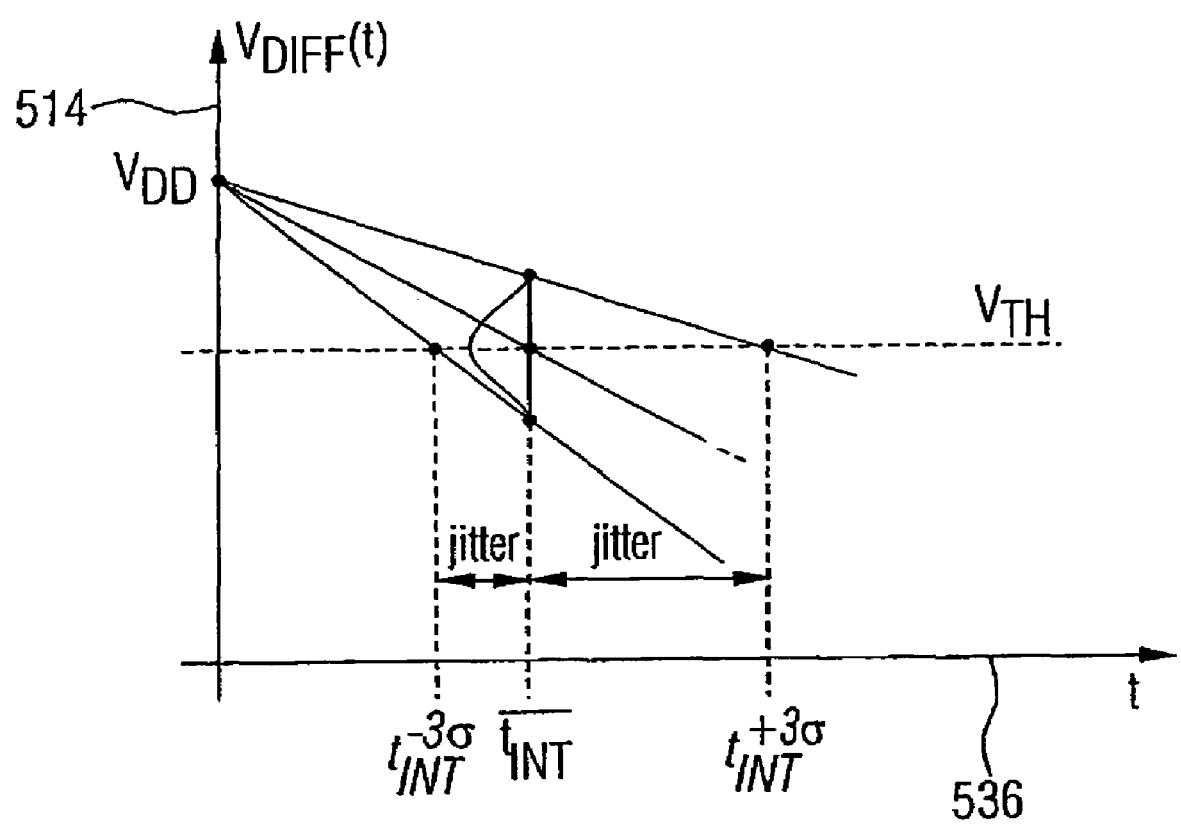
FIG. 5 shows a schematic view of the decrease of a reverse voltage of an apparatus for providing a jittered clock signal.

FIG. 5 shows a schematic characteristic of the diffusion voltage $V_{DIFF}(t)$ 514 over a time period 536, as it is shown in FIG. 2. FIG. 5 illustrates a jitter around a mean switching time of a jittered clock signal of an apparatus for providing a jittered clock signal. The switching time corresponds to a mean integration time which is the time, the diffusion voltage $V_{DIFF}(t)$ 514 needs to decrease from the supply voltage $V_{DD}$ down to the threshold voltage $V_{TH}$.

A data-rate of the random BIT stream, generated by an apparatus for providing a random bit is fixed by a me-an integration time:

$$\overline{t_{INT1}} \cong \overline{t_{INT2}} = \overline{t_{INT}} = \frac{V_{DD} - V_{TH}}{\frac{I_{DC}}{C_{DIFF}}} \quad (1)$$

Since both, leakage current $I_{DC}$ and capacitance $C_{DIFF}$ of the depletion region are directly proportional to a diffusion area $A_{DIFF}$, which defines the boundary of the p/n substrate, the voltage difference $V_{DD}-V_{TH}$ is the only parameter that can be used to change the data-rate of the random BIT stream.

For the variance of the diffusion voltage $V_{DIFF}(t)$ 514 at the end of the integration time it holds:

$$\sigma^2_{VDiff} = \frac{qI_{DC}}{C^2_{DIFF}} t_{INT} \quad (2)$$

where $q=1.6\times10^{19}$ C is the electron charge.

Being $\overline{t_{INT}} >> \sigma_{tINT}$ from equation (2) it follows:

$$\sigma^2_{VDiff} \cong \frac{qI_{DC}}{C^2_{DIFF}} \overline{t_{INT}} \quad (3)$$

As shown in FIG. 5, the integration time has a non-symmetrical probability distribution and it holds:

$$t_{INT}^{+3\sigma} - \overline{t_{INT}} = \frac{3\sigma_{V_{DIFF}}}{V_{DD} - V_{TH} + 3\sigma_{V_{DIFF}}} \overline{t_{INT}} \quad (4)$$

$$\overline{t_{INT}} - t_{INT}^{-3\sigma} = \frac{3\sigma_{V_{DIFF}}}{V_{DD} - V_{TH} + 3\sigma_{V_{DIFF}}} \overline{t_{INT}} \quad (5)$$

However, being $\sigma_{v_{DIFF}} \ll V_{DD} - V_{TH}$, follows $$t_{INT}^{+3\sigma} - \overline{t_{INT}} \cong \overline{t_{INT}} - t_{INT}^{-3\sigma} = \text{jitter} \qquad (6)$$

where, $$\text{jitter} = \frac{3\sigma_{V_{DIFF}}}{V_{DD} - V_{TH}} \overline{t_{INT}} \qquad (7)$$

From equations (1), (3) and (7), it follows:

$$\text{jitter} = 3\frac{\sqrt{C_{DIFF}}}{I_{DC}} \sqrt{q} \sqrt{V_{DD} - V_{TH}}$$

In the present embodiment, the power supply $V_{DD}$ is 1.2 V, the Inverter threshold $V_{TH}$ is 0.8 V, the diffusion area $A_{DIFF}$ is 100 μm², the depletion capacitance $C_{DIFF}$ is 0.84 fF/μm² and the leakage current $I_{DC}$ is 0.4 pA/μm².

Using the above mentioned values it holds:
$\overline{t_{INT}}$=0.84 ms
jitter=5.5 μs and a data-rate of about 1.2 kb/s ($1/\overline{t_{INT}}$) is expected.

If the obtained data-rate of the apparatus for providing a random bit is too low for a target application, the high jitter level an the delayed clock signals of the embodiment shown in FIG. 4 can be exploited to generate additional random bits for each cycle.

Figure 6:
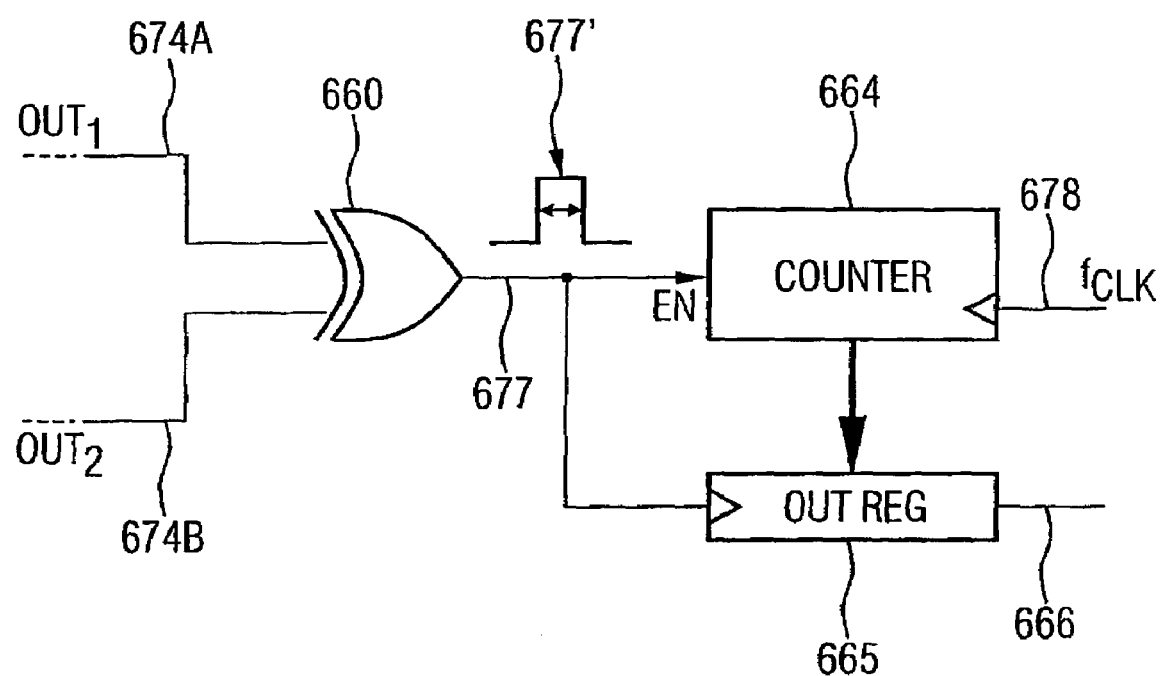
FIG. 6 shows a further embodiment of an apparatus for providing an additional random bit.

Such an arrangement for generating more random bits is shown in FIG. 6. The arrangement can be arranged in parallel to the flip-flop shown in FIG. 4. The arrangement comprises an XOR gate 660, a counter 664 and an output register 665 for outputting additional random bits 666. The XOR gate 660 is connected to a first and second delayed clock signal 674a, b. The delayed clock signals 674a, b, which are an input to the XOR gate 660 are outputted by the means for delaying, as can be seen in FIG. 4.

A compared signal 677 is the result of the XOR combination of the two delayed clock signals 674a, b. A resulting pulse 677' depends on the switching times of the delayed clock signals 674a, b and, therefore has a random duration. The random duration is quantified by the counter 664 which comprises a clock input 678 on which a clock is supplied. The counter 664 counts the number of clock cycles in which the compared signal 677 is active. Triggered by an active value of the compared signal 677, the output register 665 outputs the additional random bit 666. The value of the random bit 666 depends on the value of the counter 664.

Also, the present invention has been described above, making reference to tri-state buffers, p/n diodes and inverters, it is clear that the present invention is not limited by the shown embodiments. Instead of a tri-state buffer, any means for periodically charging the capacitance of the diode can be used. Instead of the inverter, any means can be used which compares the diffusion voltage of the diode to a threshold voltage and provides a signal that switches accordingly. Moreover, instead of the digital flip-flop and the XOR gate, any means can be used which provides an output bit depending on a comparison between two jittered clock input signals.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An apparatus for providing a jittered clock signal, comprising:
   a reverse-biased diode, wherein the diode comprises a leakage current which decreases a reverse voltage on the diode, time-dependent on a shot-noise of the leakage current;
   a unit for periodically increasing the reverse voltage of the diode to a voltage which is above a switching value; and
   a unit for comparing the reverse voltage of the diode to the switching value and for outputting a jittered clock signal dependant on the comparison.

2. The apparatus for providing a jittered clock signal according to claim 1, wherein the unit for periodically increasing the reverse voltage provides an input clock signal to the diode, wherein the input clock signal comprises an active state and a tri-state state, wherein the active state provides a supply voltage with a supply voltage value being above the switching value, and wherein the active state is periodically interrupted by the tri-state state for a discharge time period in which the reverse voltage of the diode decreases from the supply voltage value to below the switching value.

3. The apparatus for providing a jittered clock signal according to claim 1, wherein the unit for periodically increasing the reverse voltage is connected to the outputted clock signal and the period in which the reverse voltage is increased depends on the outputted clock signal.

4. The apparatus for providing a jittered clock signal according to claim 1, wherein the unit for periodically increasing the reverse voltage of the diode is a tri-state buffer.

5. The apparatus for providing a jittered clock signal according to claim 1, wherein the reverse-biased diode is a reversed-biased P-N junction.

6. The apparatus for providing a jittered clock signal according to claim 1, wherein the unit for comparing the reverse voltage to the switching value and for outputting a jittered clock signal is an inverter that is connected to the diode.

7. An apparatus for providing a random bit comprising:
   a first apparatus for providing a first jittered clock signal and a second apparatus for providing a second jittered clock signal, both comprising a reverse-biased diode, wherein the diode comprises a leakage current which decreases a reverse voltage on the diode, time-dependent on a shot-noise of the leakage current, a unit for periodically increasing the reverse voltage of the diode to a voltage which is above a switching value, and a first unit for comparing the reverse voltage of the diode to the switching value and for outputting a first and a second jittered clock signal, respectively, dependant on the comparison; and
   a second unit for comparing the first and the second jittered clock signal and for outputting a random bit dependent an a result of the comparison.

8. The apparatus for providing a random bit according to claim 7, comprising a unit for aligning a mean switching time of the first jittered clock signal to a mean switching time of the second jittered clock signal and for providing a first and a second delayed jittered clock signal to the second unit for comparing.

9. The apparatus for providing a random bit according to claim 7, wherein the second unit for comparing and for outputting is a D-flip-flop.

10. The apparatus for providing a random bit according to claim 7, wherein the second unit for comparing further comprises an XOR gate, and wherein an additional random bit is provided dependent on a time delay between edges of the first and the second jittered clock signal.

* * * * *

UNITED STATES PATENT AND TRADEMARK OFFICE
CERTIFICATE OF CORRECTION

| | | |
|---|---|---|
| PATENT NO. | : 7,193,481 B2 | Page 1 of 1 |
| APPLICATION NO. | : 10/934302 | |
| DATED | : March 20, 2007 | |
| INVENTOR(S) | : Raimondo Luzzi | |

It is certified that error appears in the above-identified patent and that said Letters Patent is hereby corrected as shown below:

On the cover:

(73) Assignee: "Infincon" should read --Infineon--

In the Specification:

At column 2, line 60, "paper, Analysis" should read --paper, "Analysis--

At column 3, line 55, "$A_{DIFF}$ Of" should read --$A_{DIFF}$ of--

At column 7, line 19, "$A_{DIFF2}$" should read --$A_{DIFF}$--

At column 7, line 28, "level an the" should read --level on the--

At column 8, line 61, "dependent an a" should read --dependent on a--

Signed and Sealed this

Twenty-fourth Day of April, 2007

JON W. DUDAS
*Director of the United States Patent and Trademark Office*